United States Patent
Katrak et al.

(10) Patent No.: US 9,784,771 B1
(45) Date of Patent: Oct. 10, 2017

(54) DIAGNOSTIC SYSTEM FOR A POWER SUPPLY

(71) Applicant: LG Chem, Ltd., Seoul (KR)

(72) Inventors: Kerfegar K. Katrak, Fenton, MI (US); Mehdi Rexha, Sterling Heights, MI (US); Kunal Tipnis, Troy, MI (US)

(73) Assignee: LG Chem Ltd., Seoul (KR)

( * ) Notice: Subject to any disclaimer, the term of this patent is extended or adjusted under 35 U.S.C. 154(b) by 0 days.

(21) Appl. No.: 15/247,497

(22) Filed: Aug. 25, 2016

Related U.S. Application Data

(60) Provisional application No. 62/352,401, filed on Jun. 20, 2016.

(51) Int. Cl.
*G01R 19/165* (2006.01)
*G01R 19/25* (2006.01)
*H02M 3/158* (2006.01)

(52) U.S. Cl.
CPC . *G01R 19/16528* (2013.01); *G01R 19/16538* (2013.01); *H02M 3/158* (2013.01); *G01R 19/25* (2013.01)

(58) Field of Classification Search
CPC .. H02M 3/158; H02M 1/32; G01R 19/16528; G01R 19/16538; G01R 19/25; G01R 19/2506; G01R 19/255; G01R 19/257; G01R 19/2509; G01R 31/3624; G06F 1/26; G06F 1/30
See application file for complete search history.

(56) References Cited

U.S. PATENT DOCUMENTS

| 5,481,730 | A | 1/1996 | Brown et al. | |
|---|---|---|---|---|
| 7,688,608 | B2 | 3/2010 | Oettinger et al. | |
| 7,969,756 | B1* | 6/2011 | Wu | G06F 17/5036 323/283 |
| 8,427,190 | B2 | 4/2013 | Tamagawa et al. | |
| 9,209,635 | B2* | 12/2015 | McCormick | H02J 7/0052 |
| 9,728,359 | B1* | 8/2017 | Katrak | H01H 47/002 |
| 2004/0100272 | A1* | 5/2004 | Styles | G01R 31/086 324/523 |
| 2006/0167565 | A1* | 7/2006 | Katrak | G05B 19/106 700/12 |
| 2009/0128186 | A1* | 5/2009 | Balasubramanian | G01K 7/015 326/38 |

(Continued)

*Primary Examiner* — Gustavo Rosario Benitez
(74) *Attorney, Agent, or Firm* — Buckert Patent & Trademark Law Firm PC; John F. Buckert

(57) ABSTRACT

A diagnostic system for a power supply having first and second output terminals that output first and second reference voltages, respectively, is provided. The diagnostic system includes a microcontroller having an analog-to-digital converter with first and second banks of channels. The microcontroller samples the first reference voltage at a first sampling rate utilizing a first common channel in the first bank of channels to obtain a first predetermined number of voltage samples. The microcontroller determines a first number of voltage samples in the first predetermined number of voltage samples in which the first reference voltage was outside of a predetermined voltage range. The microcontroller sets a first power supply diagnostic flag equal to a first fault value if the first number of voltage samples is greater than a first threshold number of voltage samples.

7 Claims, 16 Drawing Sheets

(56) References Cited

U.S. PATENT DOCUMENTS

| | | | |
|---|---|---|---|
| 2010/0078999 A1* | 4/2010 | Celenza | G06F 1/26 |
| | | | 307/31 |
| 2010/0100345 A1* | 4/2010 | Katrak | G01R 19/2509 |
| | | | 702/65 |
| 2011/0141644 A1* | 6/2011 | Hastings | H01L 31/02021 |
| | | | 361/93.2 |

* cited by examiner

DIAGNOSTIC SYSTEM FOR A POWER SUPPLY

CROSS-REFERENCE TO RELATED APPLICATION

This application claims priority to U.S. Provisional Patent Application No. 62/352,401 filed on Jun. 20, 2016, the entire contents of which are hereby incorporated by reference herein.

BACKGROUND

The inventors herein have recognized a need for an improved diagnostic system. The diagnostic system for a power supply provides a technical effect of obtaining diagnostic diversity by sampling a reference voltage from the power supply using a common channel in a first bank of channels of an analog-to-digital converter, and then sampling the reference voltage using the common channel in a second bank of channels of the analog-to-digital converter to determine fault conditions associated with the power supply.

SUMMARY

A diagnostic system for a power supply in accordance with an exemplary embodiment is provided. The power supply has first and second output terminals outputting first and second reference voltages, respectively. The diagnostic system includes a microcontroller having an analog-to-digital converter. The analog-to-digital converter has a first bank of channels and a second bank of channels. The first bank of channels includes first and second common channels and at least first and second non-common channels. The second bank of channels includes the first and second common channels and at least third and fourth non-common channels. The first common channel is electrically coupled to the first output terminal of the power supply for receiving the first reference voltage. The second common channel is electrically coupled to the second output terminal of the power supply for receiving the first reference voltage. The microcontroller is programmed to sample the first reference voltage at a first sampling rate utilizing the first common channel in the first bank of channels to obtain a first predetermined number of voltage samples. The microcontroller is further programmed to determine a first number of voltage samples in the first predetermined number of voltage samples in which the first reference voltage was outside of a predetermined voltage range. The microcontroller is further programmed to set a first power supply diagnostic flag equal to a first fault value if the first number of voltage samples is greater than a first threshold number of voltage samples. The microcontroller is further programmed to sample the first reference voltage at the first sampling rate utilizing the first common channel in the second bank of channels to obtain a second predetermined number of voltage samples. The microcontroller is further programmed to determine a second number of voltage samples in the second predetermined number of voltage samples in which the first reference voltage was outside of the predetermined voltage range. The microcontroller is further programmed to set a second power supply diagnostic flag equal to a second fault value if the second number of voltage samples is greater than a second threshold number of voltage samples.

DETAILED DESCRIPTION

Figure 1:
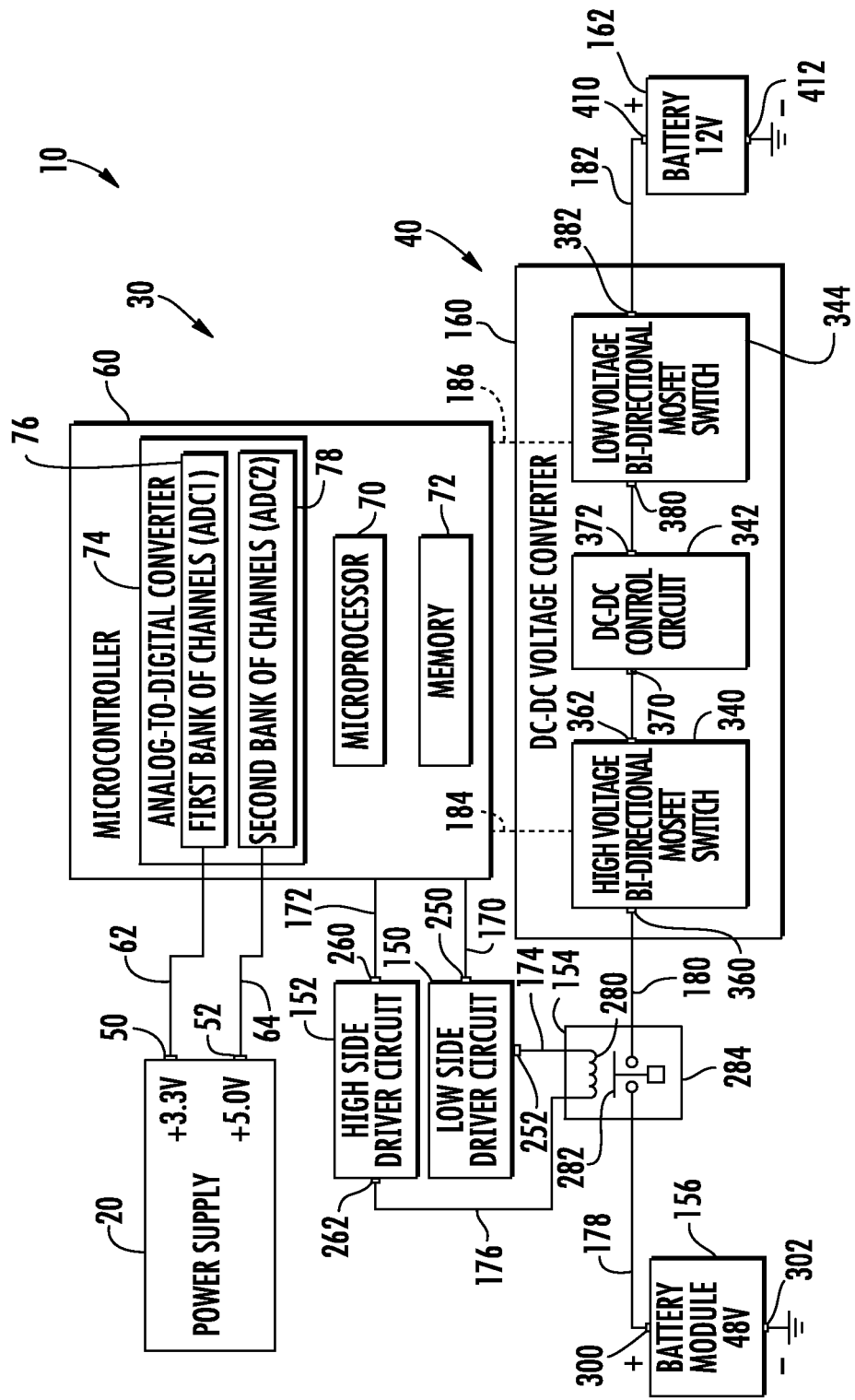
FIG. 1 is a schematic of a vehicle having a diagnostic system for a power supply in accordance with an exemplary embodiment, and a control circuit.

Referring to FIG. 1, a vehicle 10 includes a power supply 20, a diagnostic system 30 for the power supply 20 in accordance with an exemplary embodiment, and a control circuit 40. An advantage of the diagnostic system 30 is that the system 30 obtains diagnostic diversity by sampling a reference voltage from the power supply 20 using a common channel in a first bank of channels of an analog-to-digital converter 74, and then sampling the reference voltage using the common channel in a second bank of channels of the analog-to-digital converter 74 to robustly determine fault conditions associated with the power supply 20.

The power supply 20 includes an output terminal 50 and an output terminal 52. The output terminal 50 outputs a first reference voltage (e.g., 3.3 Vdc), and the output terminal 52 outputs a second reference voltage (e.g., 5.0 Vdc). The first reference voltage is utilized as an operational voltage for enabling operation of a microprocessor 70 in the microcontroller 60. The second reference voltage is utilized as an operational voltage for enabling operation of the analog-to-digital converter 74 in the microcontroller 60.

The diagnostic system 30 is provided to perform diagnostic tests on the power supply 20, which will be described in greater detail below. The diagnostic system 30 includes the microcontroller 60 and electrical sense lines 62, 64.

The microcontroller 60 includes the microprocessor 70, a memory 72, and the analog-to-digital converter 74. The microcontroller 60 is programmed to perform diagnostic steps described herein utilizing the microprocessor 70 which executes software instructions stored in the memory 72. The microprocessor 70 operably communicates with the analog-to-digital converter 74 and the memory 72.

Figure 2:
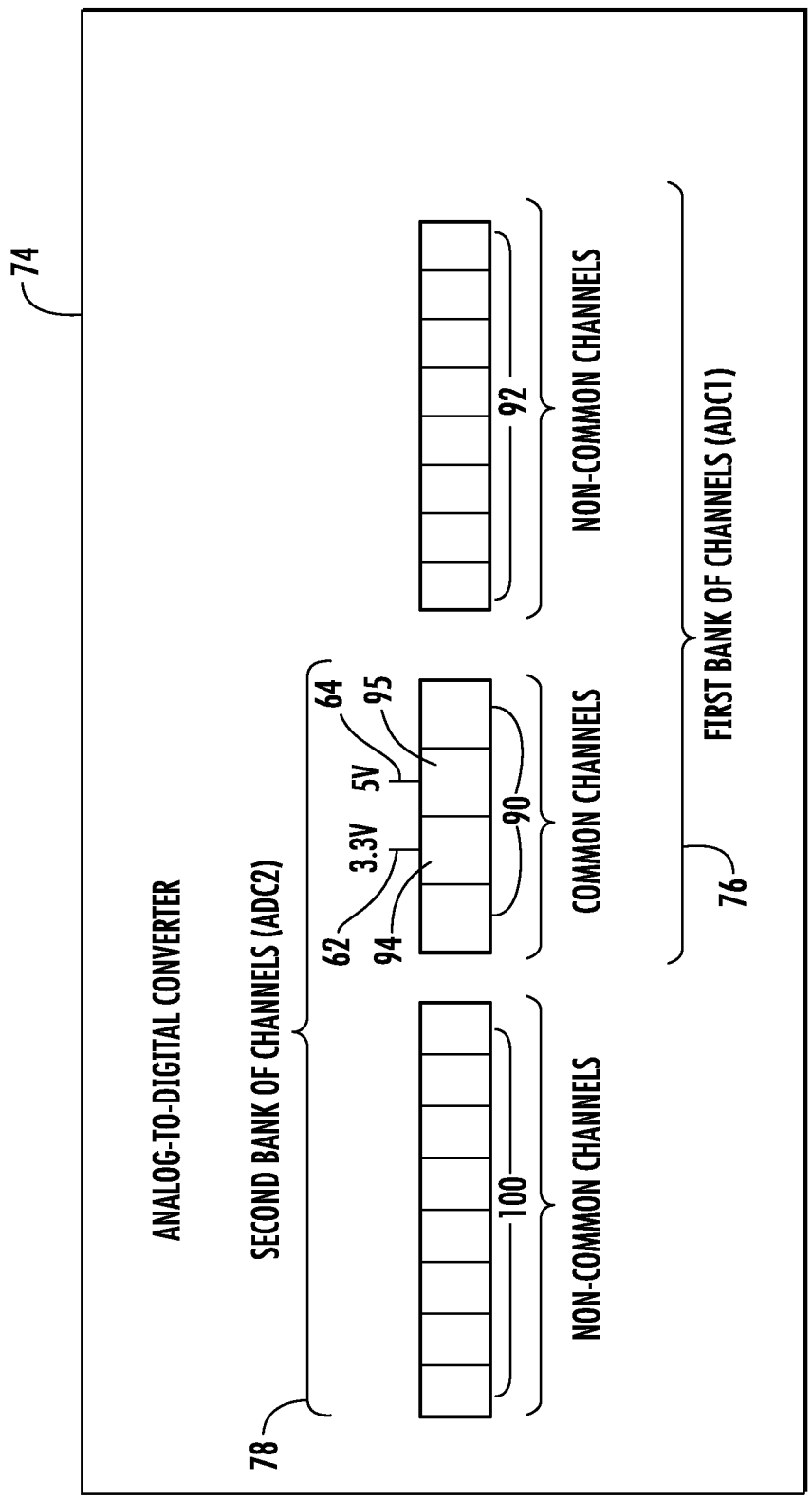
FIG. 2 is a schematic of an analog-to-digital converter utilized in a microcontroller in the diagnostic system of FIG. 1.

Referring to FIGS. 1 and 2, the analog-to-digital converter 74 includes a first bank of channels 76 (also referred to as ADC1 herein) and a second bank of channels 78 (also referred to as ADC2 herein). The first bank of channels 76 includes common channels 90 (shown in FIG. 2) and non-common channels 92, which collectively comprise twelve channels in an exemplary embodiment. The common channels 90 include common channel 94 and common channel 95. The second bank of channels 78 includes the common channels 90 and non-common channels 100, which collectively comprise twelve channels in an exemplary embodiment. Thus, both the first and second bank of channels 76, 78 share the common channels 90 including the common channel 94 and the common channel 95.

The electrical sense line 62 is electrically coupled to and between the output terminal 50 of the power supply 20 and the common channel 94 of the analog-to-digital converter 74. Further, the electrical sense line 64 is electrically coupled to and between the output terminal 52 of the power supply 20 and the common channel 95 of the analog-to-digital converter 74.

The common channels 94, 95 of the analog to digital converter 74 of the microcontroller 60 are utilized to sample the first and second reference voltages, respectively, of the power supply 20 for performing diagnostic tests on the power supply 20, as will be described in greater detail below.

Referring to FIG. 1, the control circuit 40 is utilized to control operation of the contactor 154 and the DC-DC voltage converter 160. The control circuit 40 includes the microcontroller 60, a low side driver circuit 150, a high side driver circuit 152, the contactor 154, a battery module 156, a DC-DC voltage converter 160, a battery 162, and electrical lines 170, 172, 174, 176, 178, 180, 182, 184, 186.

The low side driver circuit 150 and the high side driver circuit 152 are provided to energize and de-energize a coil 280 of the contactor 154.

The low side driver circuit 150 includes an input node 250 and output node 252. The input node 250 is electrically coupled to the microcontroller 60 utilizing the electrical line 170. The output node 252 is electrically coupled to a first end of the contactor coil 280 via the electrical line 174.

The high side driver circuit 152 includes an input node 260 and output node 262. The input node 260 is electrically coupled to the microcontroller 60 utilizing the electrical line 172. The output node 262 is electrically coupled to a second end of the contactor coil 280 via the electrical line 176.

The contactor 154 is electrically coupled in series between a positive terminal 300 of the battery module 156 and a first node 360 of a high voltage bi-directional MOSFET switch 340 in the DC-DC voltage converter 160. The contactor 154 includes a contactor coil 280, a contact 282, and a housing 284. A first end of the contactor coil 280 is electrically coupled to the output node 252 of the low side driver circuit 150 utilizing the electrical line 174. A second end of the contactor coil 280 is electrically coupled to the output node 262 of the high side driver circuit 152 via the electrical line 176. Further, a first end of the contact 282 is selectively electrically coupled to the positive terminal 300 of the battery module 156 utilizing the electrical line 178. Further, a second end of the contact 282 is selectively electrically coupled to a first node 360 of the high voltage bi-directional MOSFET switch 340. When the microcontroller 60 generates first and second control signals that are received by the low side driver circuit 150 and the high side driver circuit 152, respectively, the driver circuits 150, 152, energize the contactor coil 280, which moves the contact 282 to a closed operational position. Alternately, when the microcontroller 60 stops generating the first and second control signals, the driver circuits 150, 152 de-energize the contactor coil 280, which moves the contact 282 to an open operational position.

The battery module 156 includes a positive terminal 300 and a negative terminal 302. In an exemplary embodiment, the battery module 156 generates 48 Vdc between the positive terminal 300 and the negative terminal 302.

The DC-DC voltage converter 160 is provided to receive a first voltage level (e.g., 48 Vdc) from the battery module 156 and to output a second voltage level (e.g., 12 Vdc) to the battery 162. Alternately, the DC-DC voltage converter 160 can receive the second voltage level from the battery 162 and output a first voltage level to other devices electrically coupled to the electrical line 180, when the contactor 154 has an open operational position. The DC-DC voltage converter 160 includes the high voltage bi-directional MOSFET switch 340, a DC-DC control circuit 342, and a low voltage bi-directional MOSFET switch 344.

Figure 3:
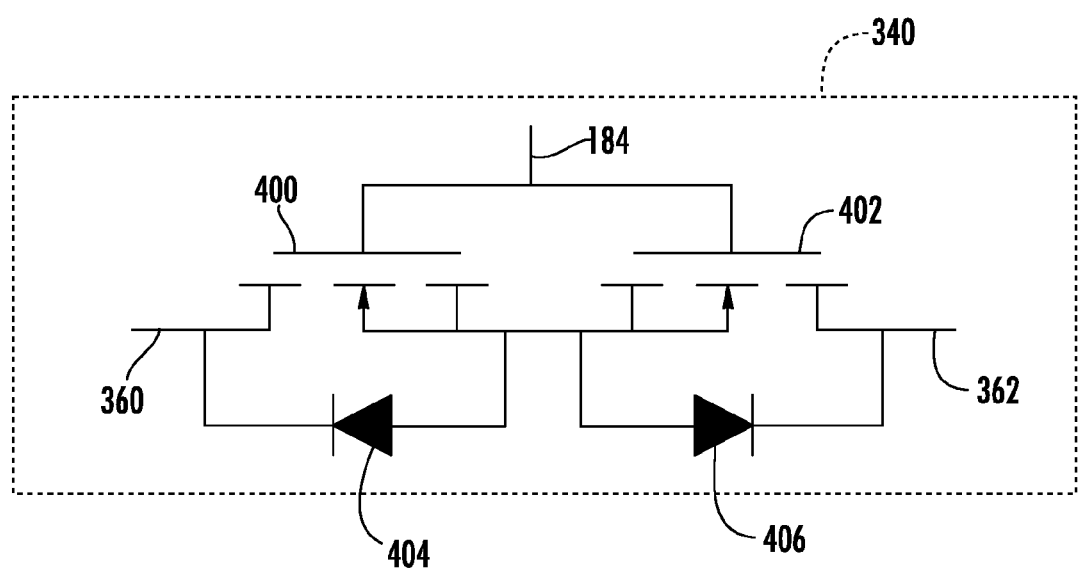
FIG. 3 is a schematic of a bi-directional MOSFET switch utilized in a DC-DC voltage converter in the control circuit of FIG. 1.
Figure 4:
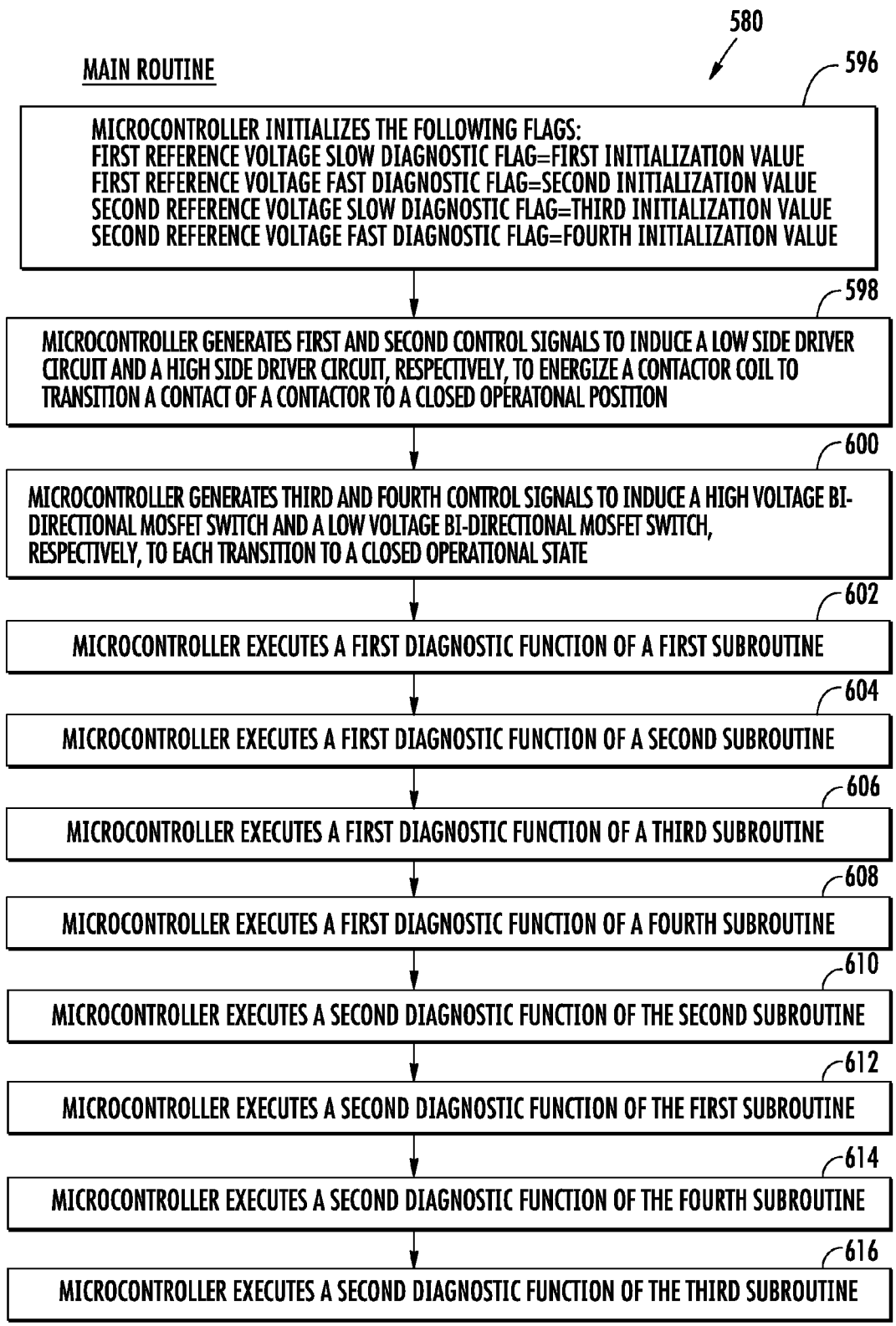
FIGS. 4-16 are flowcharts of a method for performing diagnostic tests on the power supply of FIG. 1.

Referring to FIGS. 1 and 3, the high voltage bi-directional MOSFET switch 340 includes a first node 360 and a second node 362. The first node 360 is electrically coupled to a first end of the contact 282 utilizing the electrical line 180. The second node 362 is electrically coupled to a first node 370 of the DC-DC control circuit 342. In an exemplary embodiment, the high voltage bi-directional MOSFET switch 340 includes MOSFETs 400, 402 and diodes 404, 406 as illustrated in FIG. 3. Of course, in an alternative embodiment, the high voltage bi-directional MOSFET switch 340 could be replaced with another type of bi-directional switch having desired voltage and current capabilities. When the microcontroller 60 generates a third control signal that is received by the high voltage bi-directional MOSFET switch 340 via the electrical line 184, the switch 340 transitions to a closed operational state. When the microcontroller 60 stops generating the third control signal, the switch 340 transitions to an open operational state.

The DC-DC control circuit 342 has a first node 370 and a second node 372. The first node 370 is electrically coupled to the second node 362 of the high voltage bi-directional MOSFET switch 340. The second node 372 is electrically coupled to the first node 380 of the low voltage bi-directional MOSFET switch 344.

The low voltage bi-directional MOSFET switch 344 includes a first node 380 and a second node 382. The first node 380 is electrically coupled to the second node 372 of the DC-DC control circuit 342. The second node 382 is electrically coupled to the battery 162 utilizing the electrical line 182. In an exemplary embodiment, the low voltage bi-directional MOSFET switch 344 has an identical structure as the high voltage bi-directional MOSFET switch 340 illustrated in FIG. 3. Of course, in an alternative embodiment, the high voltage bi-directional MOSFET switch 340 could be replaced with another type of bi-directional switch having desired voltage and current capabilities. When the microcontroller 60 generates a fourth control signal that is received by the low voltage bi-directional MOSFET switch 344 via the electrical line 186, the switch 344 transitions to a closed operational state. When the microcontroller 60 stops generating the third control signal, the switch 344 transitions to an open operational state.

The battery 162 includes a positive terminal 410 and a negative terminal 412. In an exemplary embodiment, the battery 162 generates 12 Vdc between the positive terminal 410 and the negative terminal 412.

Referring to FIGS. 1, 2 and 4-16, a flowchart of a method for performing diagnostic tests on the power supply 20 and for implementing control steps based on the results of the diagnostic tests, will now be explained.

The microcontroller 60 executes a main routine 580 (shown in FIG. 4) which calls functions of other subroutines for performing the diagnostic tests and for implementing the control steps based on the results of the diagnostic tests. The main routine 580 will now be described.

At step 596, the microcontroller 60 initializes the following flags:
First reference voltage slow diagnostic flag=first initialization value
First reference voltage fast diagnostic flag=second initialization value
Second reference voltage slow diagnostic flag=third initialization value
Second reference voltage fast diagnostic flag=fourth initialization value. After step 596, the method advances to step 598.

At step 598, the microcontroller 60 generates first and second control signals to induce the low side driver circuit 150 and the high side driver circuit 152, respectively, to energize the contactor coil 280 to transition the contact 282 of the contactor 154 to a closed operational position. After step 598, the method advances to step 600.

At step 600, the microcontroller 60 generates third and fourth control signals to induce the high voltage bi-directional MOSFET switch 340 and the low voltage bi-directional MOSFET switch 344, respectively, to each transition to a closed operational state. After step 600, the method advances to step 602.

At step 602, the microcontroller 60 executes a first diagnostic function 628 (shown in FIG. 5) of a first subroutine. After step 602, the method advances to step 604.

At step 604, the microcontroller 60 executes a first diagnostic function 648 (shown in FIG. 6) of a second subroutine. After step 604, the method advances to step 606.

At step 606, the microcontroller 60 executes a first diagnostic function 668 (shown in FIG. 7) of a third subroutine. After step 606, the method advances to step 608.

At step 608, the microcontroller 60 executes a first diagnostic function 688 (shown in FIG. 8) of a fourth subroutine. After step 608, the method advances to step 610.

At step 610, the microcontroller 60 executes a second diagnostic function 708 (shown in FIGS. 9 and 10) of the second subroutine. After step 610, the method advances to step 612.

At step 612, the microcontroller 60 executes a second diagnostic function 738 (shown in FIGS. 11 and 12) of the first subroutine. After step 612, the method advances to step 614.

At step 614, the microcontroller 60 executes a second diagnostic function 768 (shown in FIGS. 13 and 14) of the fourth subroutine. After step 614, the method advances to step 616.

At step 616, the microcontroller 60 executes a second diagnostic function 808 (shown in FIGS. 15 and 16) of the third subroutine.

Figure 5:
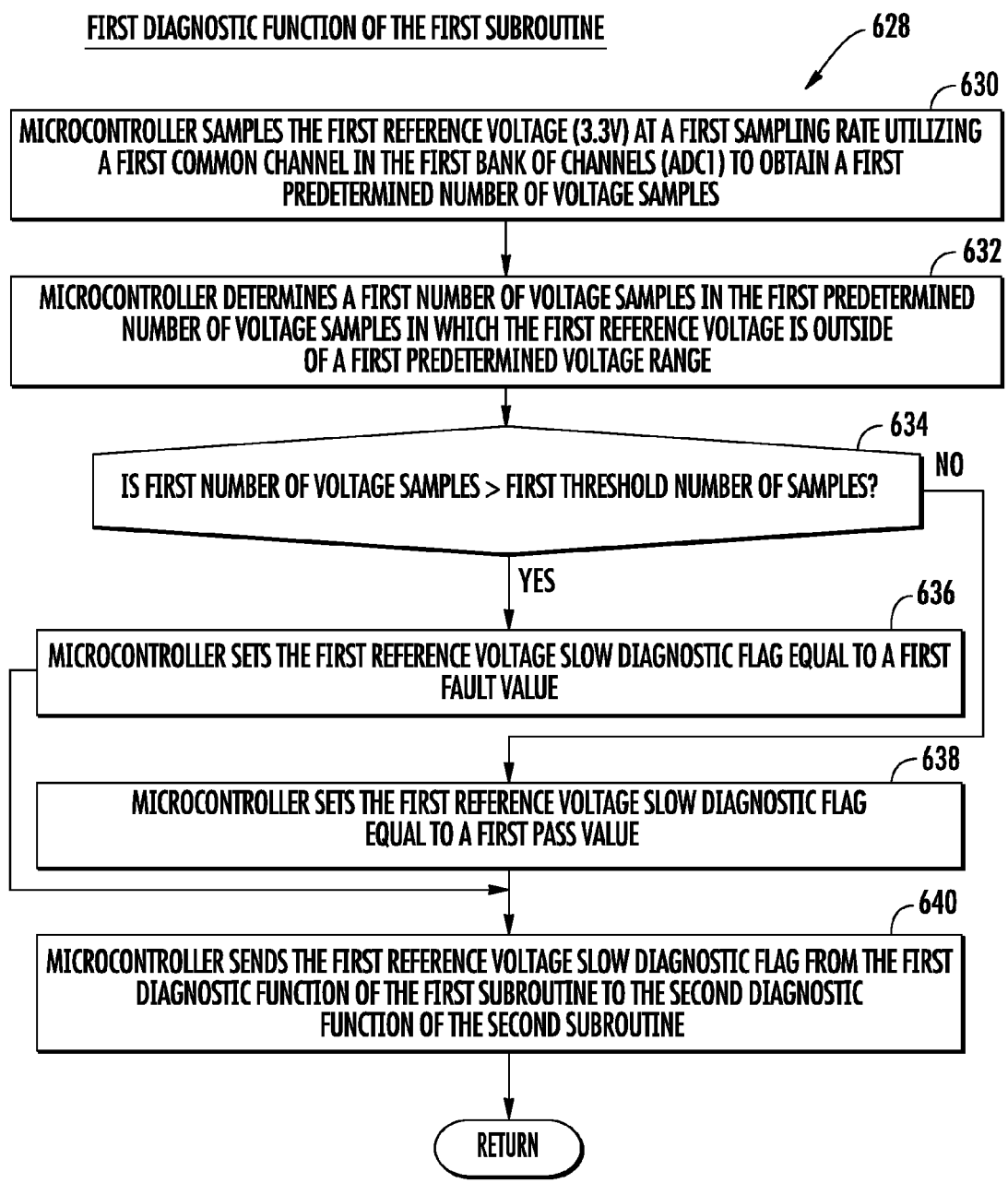

Referring to FIG. 5, the first diagnostic function 628 of the first subroutine will now be explained.

At step 630, the microcontroller 60 samples the first reference voltage (3.3V) at a first sampling rate utilizing a first common channel 94 (shown in FIG. 2) in the first bank of channels 76 (ADC1) to obtain a first predetermined number of voltage samples. After step 630, the method advances to step 632.

At step 632, the microcontroller 60 determines a first number of voltage samples in the first predetermined number of voltage samples in which the first reference voltage is outside of a first predetermined voltage range. After step 632, the method advances to step 634.

At step 634, the microcontroller 60 makes a determination as to whether the first number of voltage samples is greater than a first threshold number of samples. If the value of step 634 equals "yes", the method advances to step 636. Otherwise, the method advances to step 638.

At step 636, the microcontroller 60 sets the first reference voltage slow diagnostic flag equal to a first fault value. After step 636, the method advances to step 640.

Referring again to step 634, if the value of step 634 equals "no", the method advances to step 638. At step 638, the microcontroller 60 sets the first reference voltage slow diagnostic flag equal to a first pass value. After step 638, the method advances to step 640.

At step 640, the microcontroller 60 sends the first reference voltage slow diagnostic flag from the first diagnostic function 628 of the first subroutine to the second diagnostic function 708 (shown in FIGS. 9 and 10) of the second subroutine. After step 640, the method returns to the main routine 580 (shown in FIG. 4).

Figure 6:
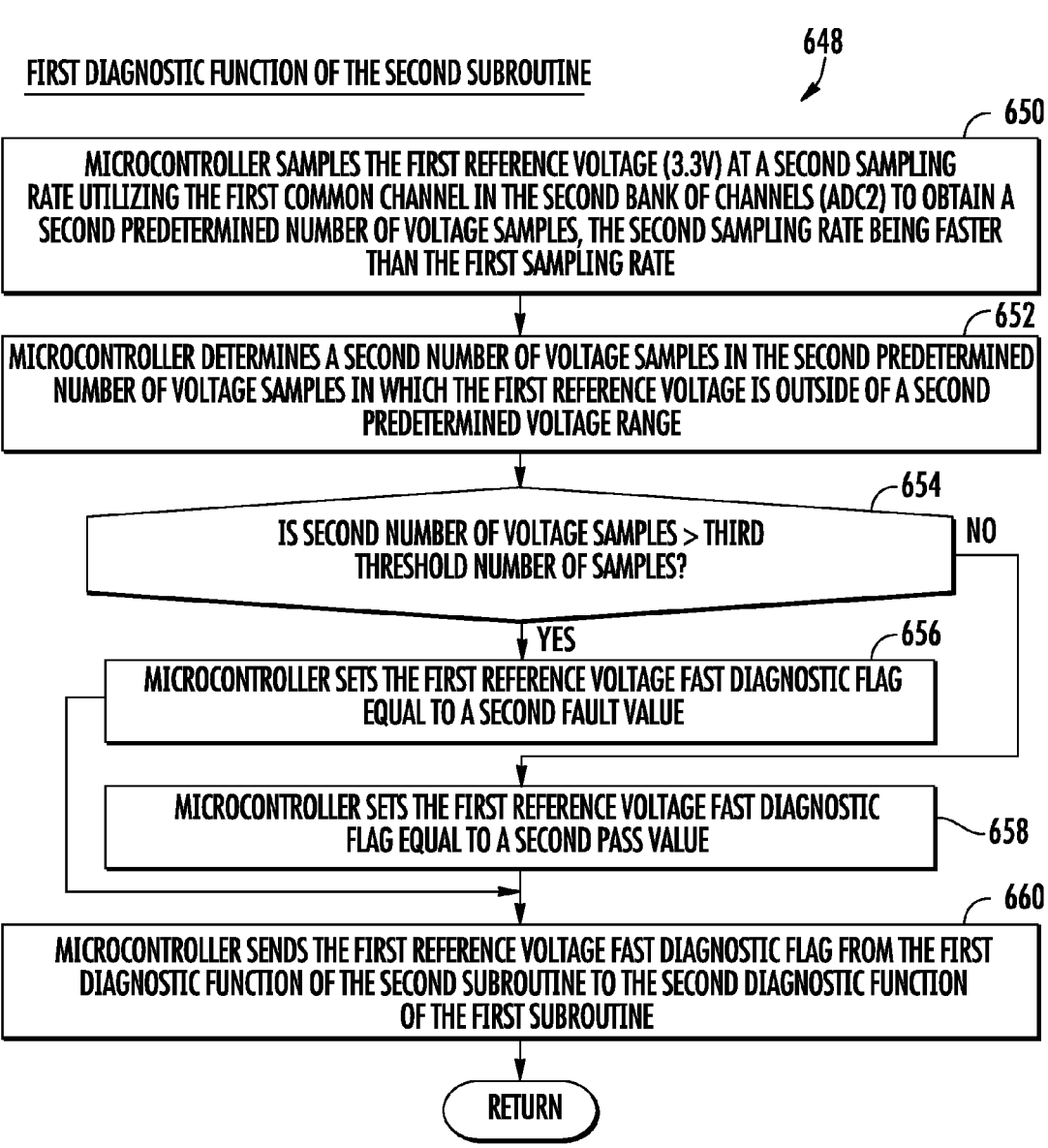

Referring to FIG. 6, the first diagnostic function 628 of the second subroutine will now be explained.

At step 650, the microcontroller 60 samples the first reference voltage (3.3) at a second sampling rate utilizing the first common channel 94 (shown in FIG. 2) in the second bank of channels 78 (ADC2) to obtain a second predetermined number of voltage samples. The second sampling rate is faster than the first sampling rate. After step 650, the method advances to step 652.

At step 652, the microcontroller 60 determines a second number of voltage samples in the second predetermined number of voltage samples in which the first reference voltage is outside of a second predetermined voltage range. After step 652, the method advances to step 654.

At step 654, the microcontroller 60 makes a determination as to whether the second number of voltage samples is greater than a third threshold number of samples. If the value of step 654 equals "yes", the method advances to step 656. Otherwise, the method advances to step 658.

At step 656, the microcontroller 60 sets the first reference voltage fast diagnostic flag equal to a second fault value. After step 656, the method advances to step 660.

Referring again to step 654, if the value of step 654 equals "no", the method advances to step 658. At step 658, the microcontroller 60 sets the first reference voltage fast diagnostic flag equal to a second pass value. After step 658, the method advances to step 660.

At step 660, the microcontroller 60 sends the first reference voltage fast diagnostic flag from the first diagnostic function 648 of the second subroutine to the second diagnostic function 738 (shown in FIGS. 11 and 12) of the first subroutine. After step 660, the method returns to the main routine 580 (shown in FIG. 4).

Figure 7:
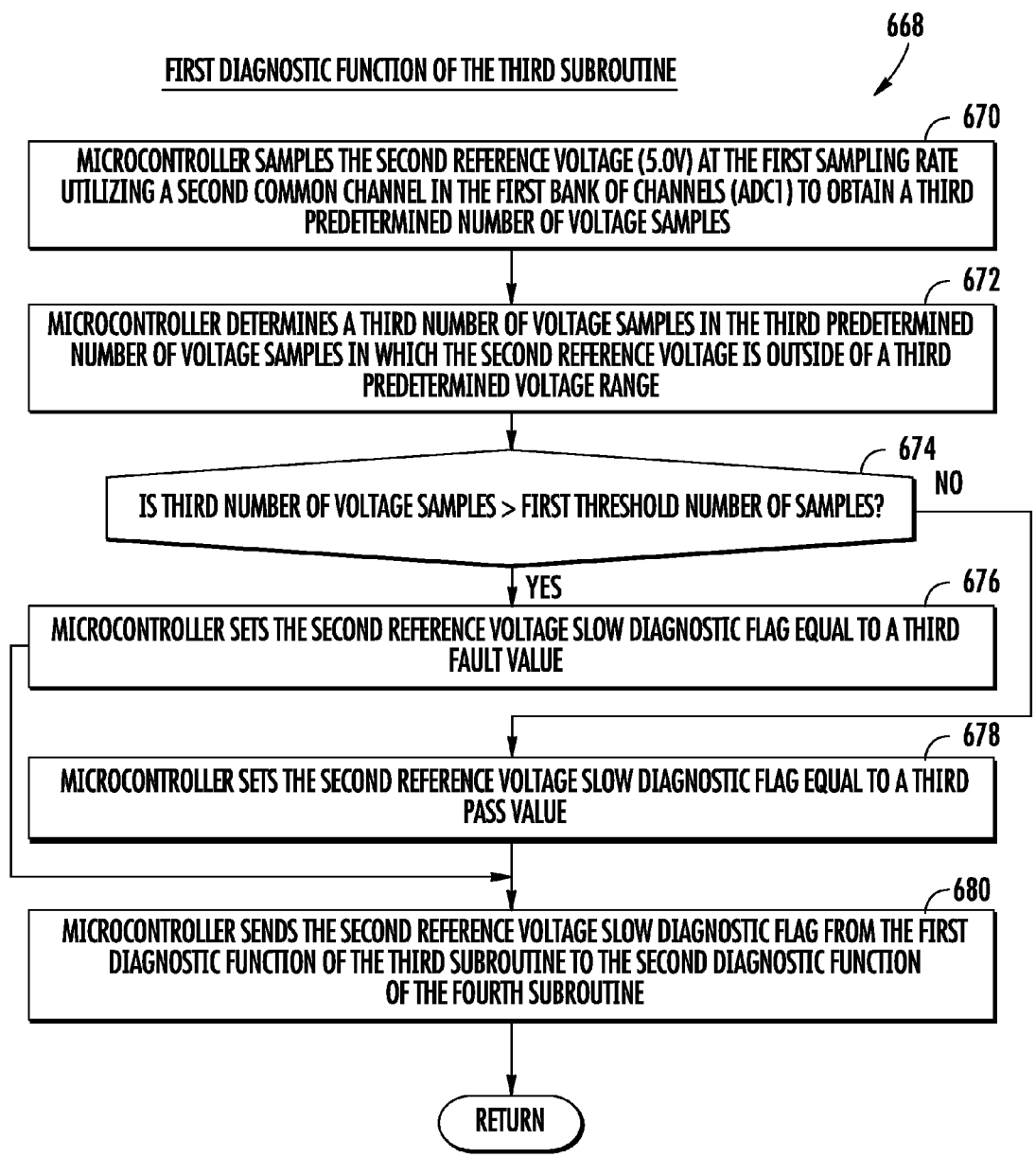

Referring to FIG. 7, the first diagnostic function 668 of the third subroutine will now be explained.

At step 670, the microcontroller 60 samples the second reference voltage (5.0) at the first sampling rate utilizing a second common channel 95 (shown in FIG. 2) in the first bank of channels 76 (ADC1) to obtain a third predetermined number of voltage samples. After step 670, the method advances to step 672.

At step 672, the microcontroller 60 determines a third number of voltage samples in the third predetermined number of voltage samples in which the second reference voltage is outside of a third predetermined voltage range. After step 672, the method advances to step 674.

At step 674, the microcontroller 60 makes a determination as to whether the third number of voltage samples is greater than a first threshold number of samples. If the value of step 674 equals "yes", the method advances to step 676. Otherwise, the method advances to step 678.

At step 676, the microcontroller 60 sets the second reference voltage slow diagnostic flag equal to a third fault value. After step 676, the method advances to step 680.

Referring again to step 674, if the value of step 674 equals "no", the method advances to step 678. At step 678, the microcontroller 60 sets the second reference voltage slow diagnostic flag equal to a third pass value. After step 678, the method advances to step 680.

At step 680, the microcontroller 60 sends the second reference voltage slow diagnostic flag from the first diagnostic function 668 of the third subroutine to the second diagnostic function 678 (shown in FIGS. 13 and 14) of the fourth subroutine. After step 680, the method returns to the main routine 580 (shown in FIG. 4).

Figure 8:
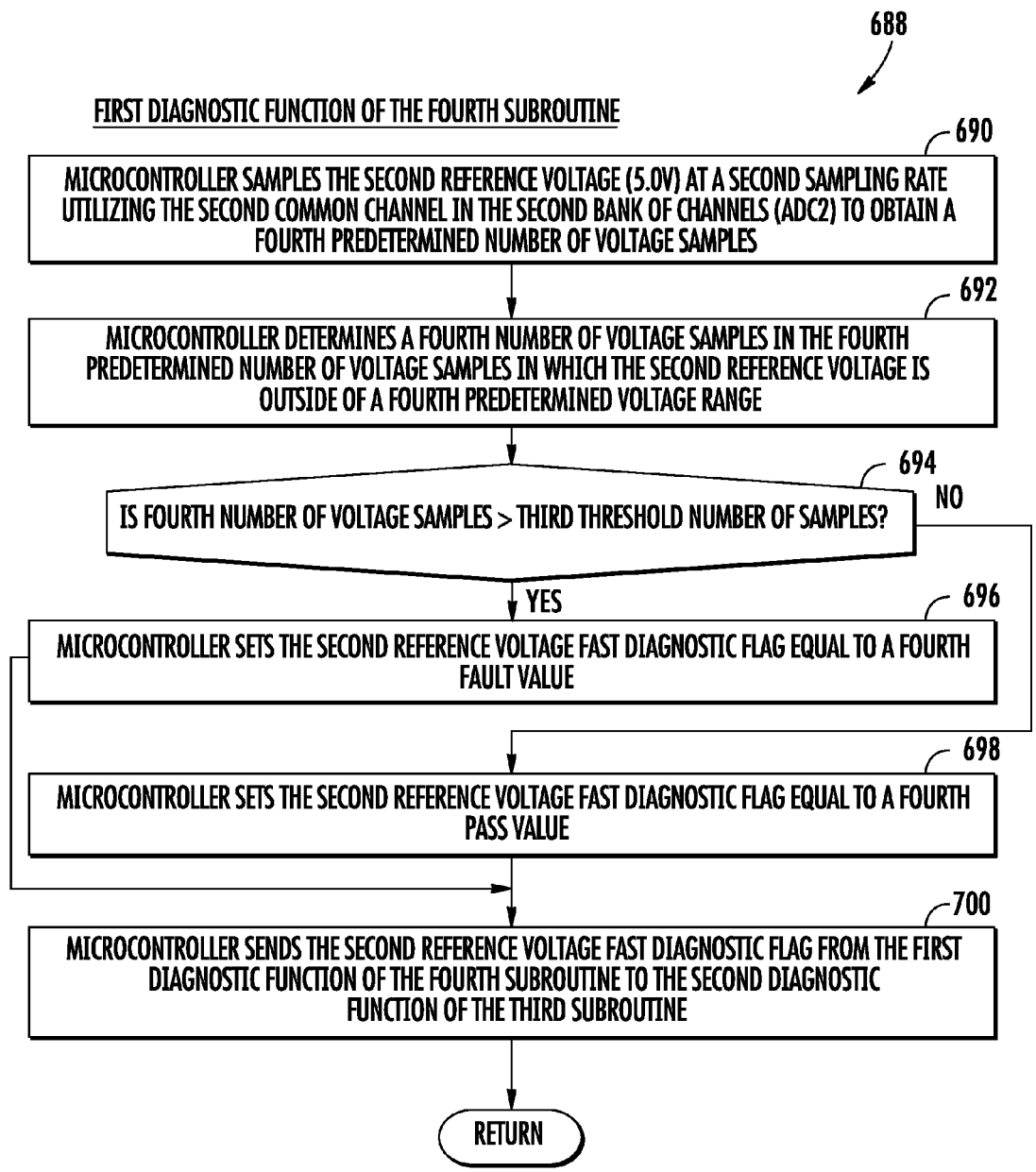

Referring to FIG. 8, the first diagnostic function 688 of the fourth subroutine will now be explained.

At step 690, the microcontroller 60 samples the second reference voltage (5.0) at the second sampling rate utilizing the second common channel 95 (shown in FIG. 2) in the second bank of channels 78 (ADC2) to obtain a fourth predetermined number of voltage samples. After step 690, the method advances to step 692.

At step 692, the microcontroller 60 determines a fourth number of voltage samples in the fourth predetermined number of voltage samples in which the second reference voltage is outside of a fourth predetermined voltage range. After step 692, the method advances to step 694.

At step 694, the microcontroller 60 makes a determination as to whether the fourth number of voltage samples is greater than a third threshold number of samples. If the value of step 694 equals "yes", the method advances to step 696. Otherwise, the method advances to step 698.

At step 696, the microcontroller 60 sets the second reference voltage fast diagnostic flag equal to a fourth fault value. After step 696, the method advances to step 700.

Referring again to step 694, if the value of step 694 equals "no", the method advances to step 698. At step 698, the microcontroller 60 sets the second reference voltage fast diagnostic flag equal to a fourth pass value. After step 698, the method advances to step 700.

At step 700, the microcontroller 60 sends the second reference voltage fast diagnostic flag from the first diagnostic function 688 of the fourth subroutine to the second diagnostic function 808 (shown in FIGS. 15 and 16) of the third subroutine. After step 700, method returns to the main routine 580 (shown in FIG. 4).

Figure 9:
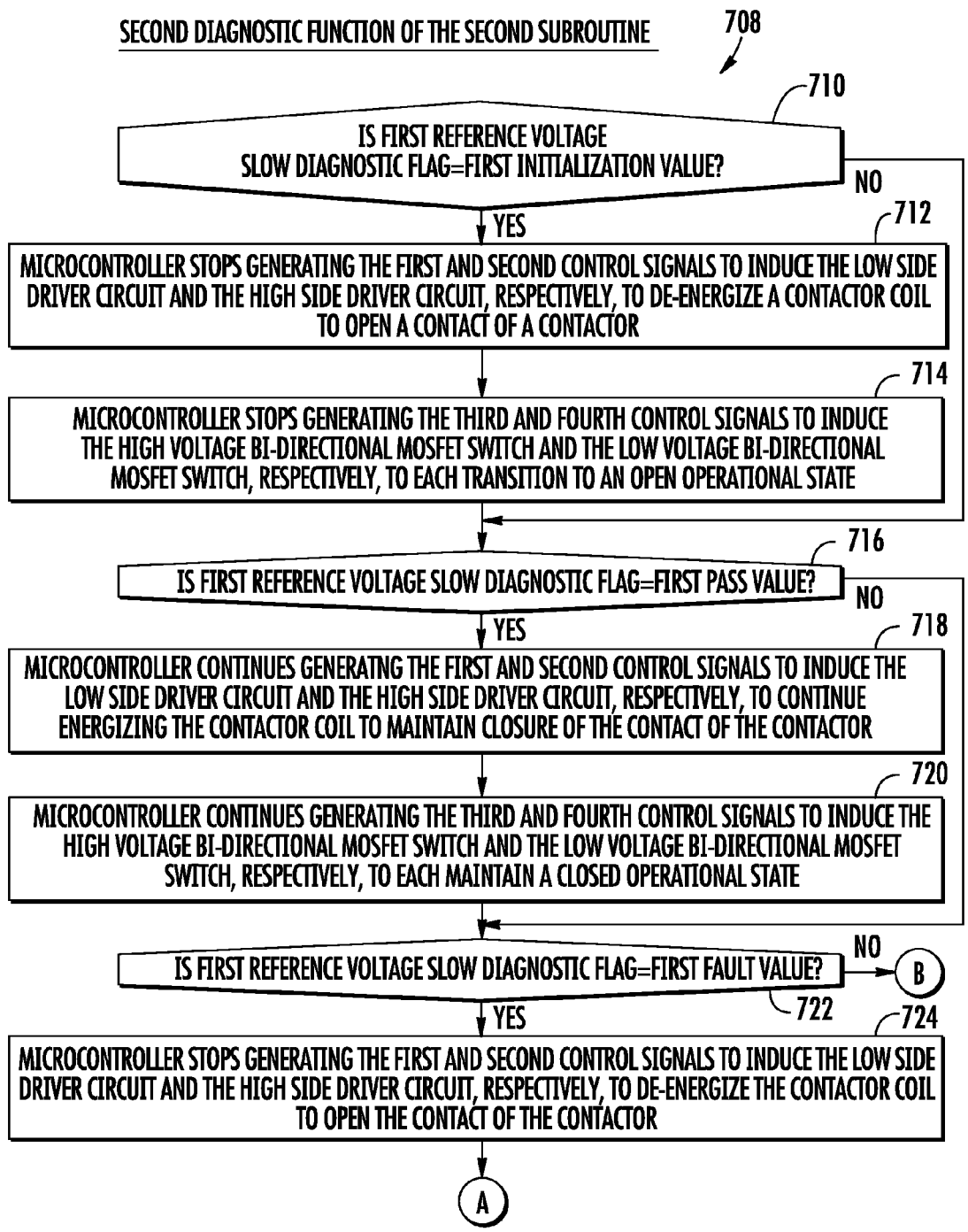
Figure 10:
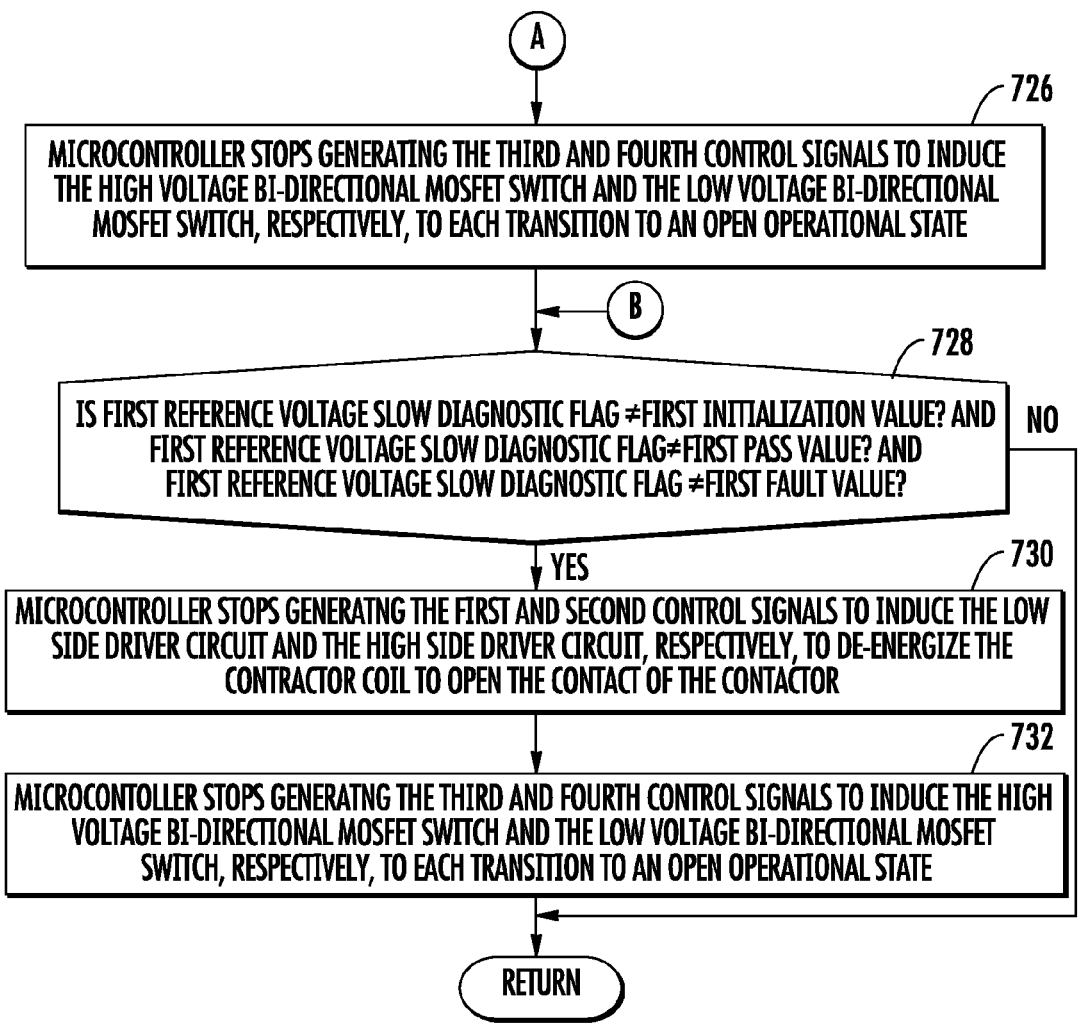

Referring to FIGS. 9 and 10, the second diagnostic function 708 of the second subroutine will now be explained.

At step 710, the microcontroller 60 makes a determination as to whether the first reference voltage slow diagnostic flag is equal to the first initialization value. If the value of step 710 and equals "yes", the method advances to step 712. Otherwise, the method advances to step 716.

At step 712, the microcontroller 60 stops generating first and second control signals to induce the low side driver circuit 150 and the high side driver circuit 152, respectively, to de-energize the contactor coil 280 to open the contact 282 of the contactor 154. After step 712, the method advances to step 714.

At step 714, the microcontroller 60 stops generating third and fourth control signals to induce the high voltage bi-directional MOSFET switch 340 and the low voltage bi-directional MOSFET switch 344, respectively, to transition to an open operational state. After step 714, the method advances to step 716.

At step 716, the microcontroller 60 makes a determination as to whether the first reference voltage slow diagnostic flag is equal to the first pass value. If the value of step 716 equals "yes", the method advances to step 718. Otherwise, the method advances to step 722.

At step 718, the microcontroller 60 continues generating the first and second control signals to induce the low side driver circuit 150 and the high side driver circuit 152, respectively, to continue energizing the contactor coil 280 to maintain closure of the contact 282 of the contactor 154. After step 718, the method advances to step 720.

At step 720, the microcontroller 60 continues generating the third and fourth control signals to induce the high voltage bi-directional MOSFET switch 340 and the low voltage bi-directional MOSFET switch 344, respectively, to maintain a closed operational state. After step 720, the method advances to step 722.

At step 722, the microcontroller 60 makes a determination as to whether the first reference voltage slow diagnostic flag is equal to the first fault value. If the value of step 722 equals "yes", the method advances to step 724. Otherwise, the method advances to step 728.

At step 724, the microcontroller 60 stops generating the first and second control signals to induce the low side driver circuit 150 and the high side driver circuit 152, respectively, to de-energize the contactor coil 280 to open the contact 282 of the contactor 154. After step 724, the method advances to step 726.

At step 726, the microcontroller 60 stops generating the third and fourth control signals to induce the high voltage bi-directional MOSFET switch 340 and the low voltage bi-directional MOSFET switch 344, respectively, to transition to an open operational state. After step 726, the method advances to step 728.

At step 728, the microcontroller 60 makes a determination as to whether the first reference voltage slow diagnostic flag is not equal to the first initialization value, and whether the first reference voltage slow diagnostic flag is not equal to the first pass value, and whether the first reference voltage slow diagnostic flag is not equal to the first fault value. If the value of step 728 equals "yes", the method advances to step 730. Otherwise, the method returns to the main routine 580 (shown in FIG. 4).

At step 730, the microcontroller 60 stops generating the first and second control signals to induce the low side driver circuit 150 and the high side driver circuit 152, respectively, to de-energize the contactor coil 280 to open the contact 282 of the contactor 154. After step 730, the method advances to step 732.

At step 732, the microcontroller 60 stops generating the third and fourth control signals to induce the high voltage bi-directional MOSFET switch 340 and the low voltage bi-directional MOSFET switch 344, respectively, to transition to an open operational state. After step 732, the method returns to the main routine 580 (shown in FIG. 4).

Figure 11:
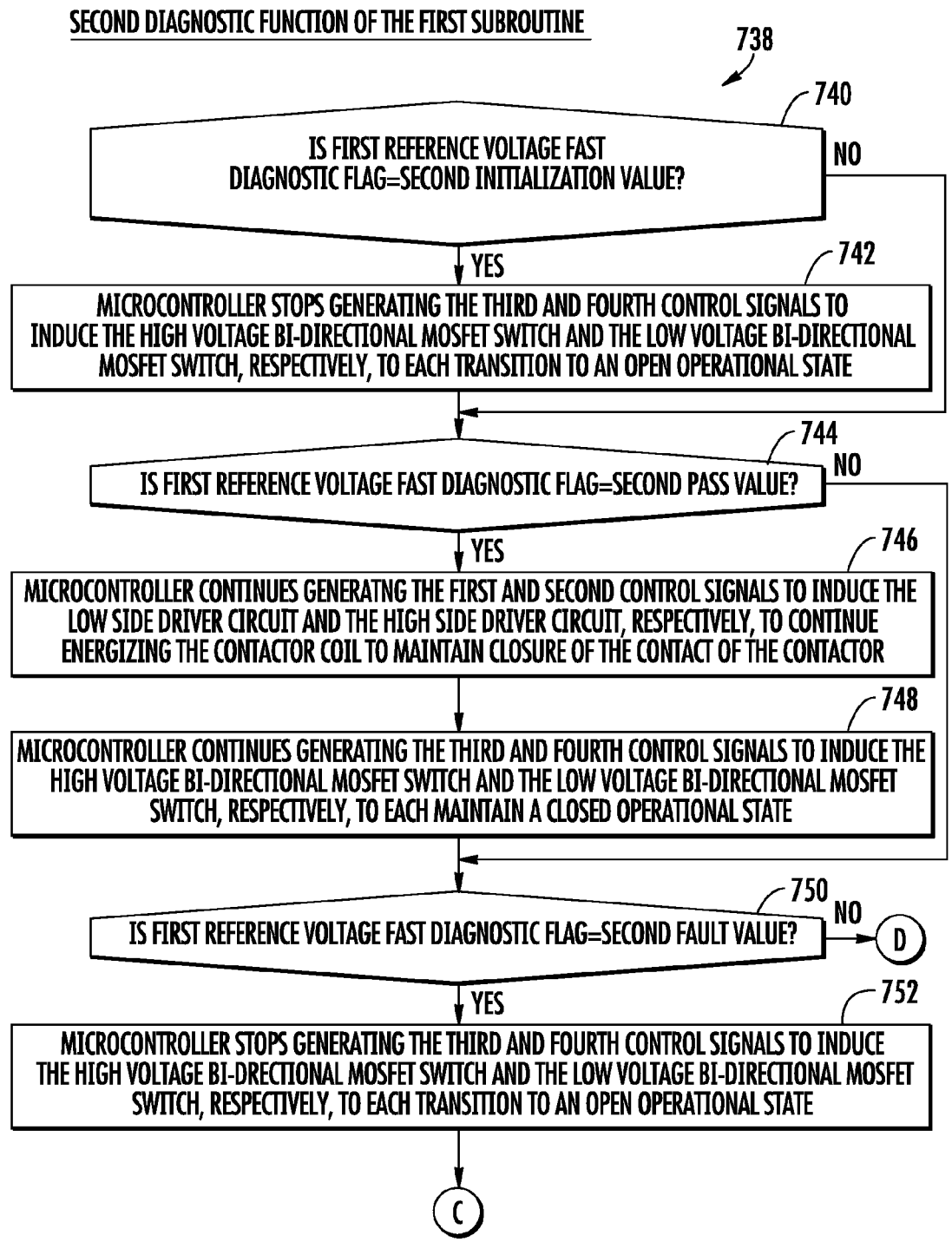
Figure 12:
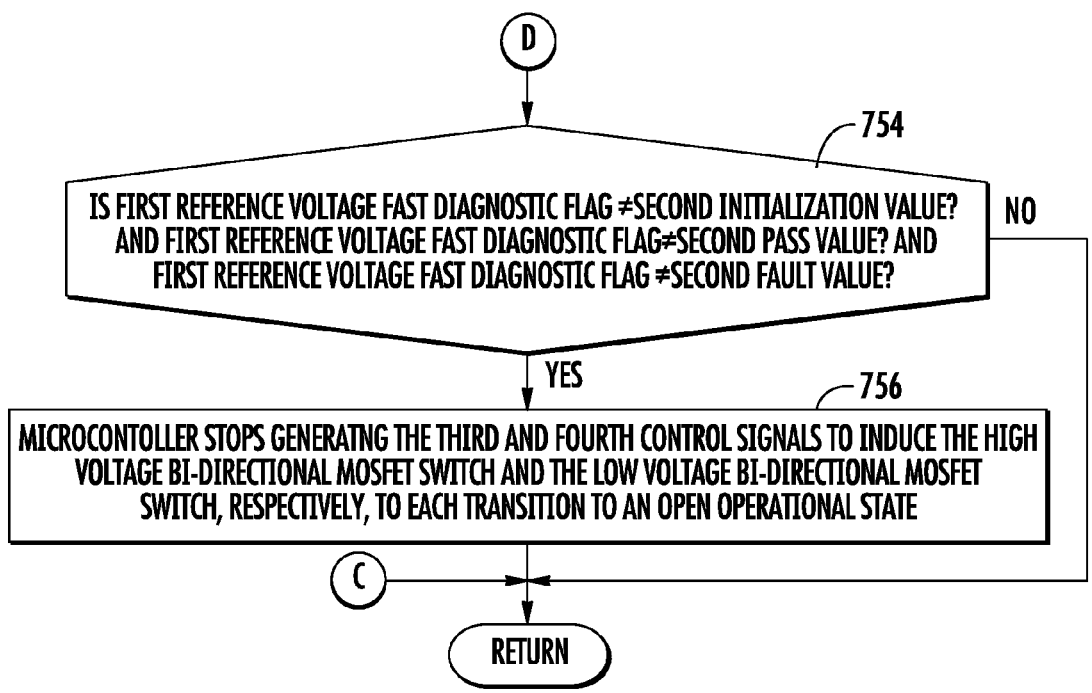

Referring to FIGS. 11 and 12, the second diagnostic function 738 of the first subroutine will now be explained.

At step 740, the microcontroller 60 makes a determination as to whether the first reference voltage fast diagnostic flag is equal to the second initialization value. If the value of step 740 equals "yes", the method advances to step 742. Otherwise, the method advances to step 744.

At step 742, the microcontroller 60 stops generating third and fourth control signals to induce the high voltage bi-directional MOSFET switch 340 and the low voltage bi-directional MOSFET switch 344, respectively, to transition to an open operational state. After step 742, the method advances to step 744.

At step 744, the microcontroller 60 makes a determination as to whether the first reference voltage fast diagnostic flag is equal to the second pass value. If the value of step 744 equals "yes", the method advances to step 746. Otherwise, the method advances to step 750.

At step 746, the microcontroller 60 continues generating the first and second control signals to induce the low side driver circuit 150 and the high side driver circuit 152, respectively, to continue energizing the contactor coil 280 to maintain closure of the contact 282 of the contactor 154. After step 746, the method advances to step 748.

At step 748, the microcontroller 60 continues generating the third and fourth control signals to induce the high voltage bi-directional MOSFET switch 340 and the low voltage bi-directional MOSFET switch 344, respectively, to maintain a closed operational state. After step 748, the method advances to step 750.

At step 750, the microcontroller 60 makes a determination as to whether the first reference voltage fast diagnostic flag is equal to the second fault value. If the value of step 750 equals "yes", the method advances to step 752. Otherwise, the method advances to step 754.

At step 752, the microcontroller 60 stops generating the third and fourth control signals to induce the high voltage bi-directional MOSFET switch 340 and the low voltage bi-directional MOSFET switch 344, respectively, to transition to an open operational state. After step 752, the method returns to the main routine 580 (shown in FIG. 4).

At step 754, the microcontroller 60 makes a determination as to whether the first reference voltage fast diagnostic flag is not equal to the second initialization value, and whether the first reference voltage fast diagnostic flag is not equal to the second pass value, and whether the first reference voltage fast diagnostic flag is not equal to the second fault value. If the value of step 754 equals "yes", the method advances to step 756. Otherwise, the method returns to the main routine 580 (shown in FIG. 4).

At step 756, the microcontroller 60 stops generating the third and fourth control signals to induce the high voltage bi-directional MOSFET switch 340 and the low voltage bi-directional MOSFET switch 344, respectively, to transition to an open operational state. After step 756, the method returns to the main routine 580 (shown in FIG. 4).

Figure 13:
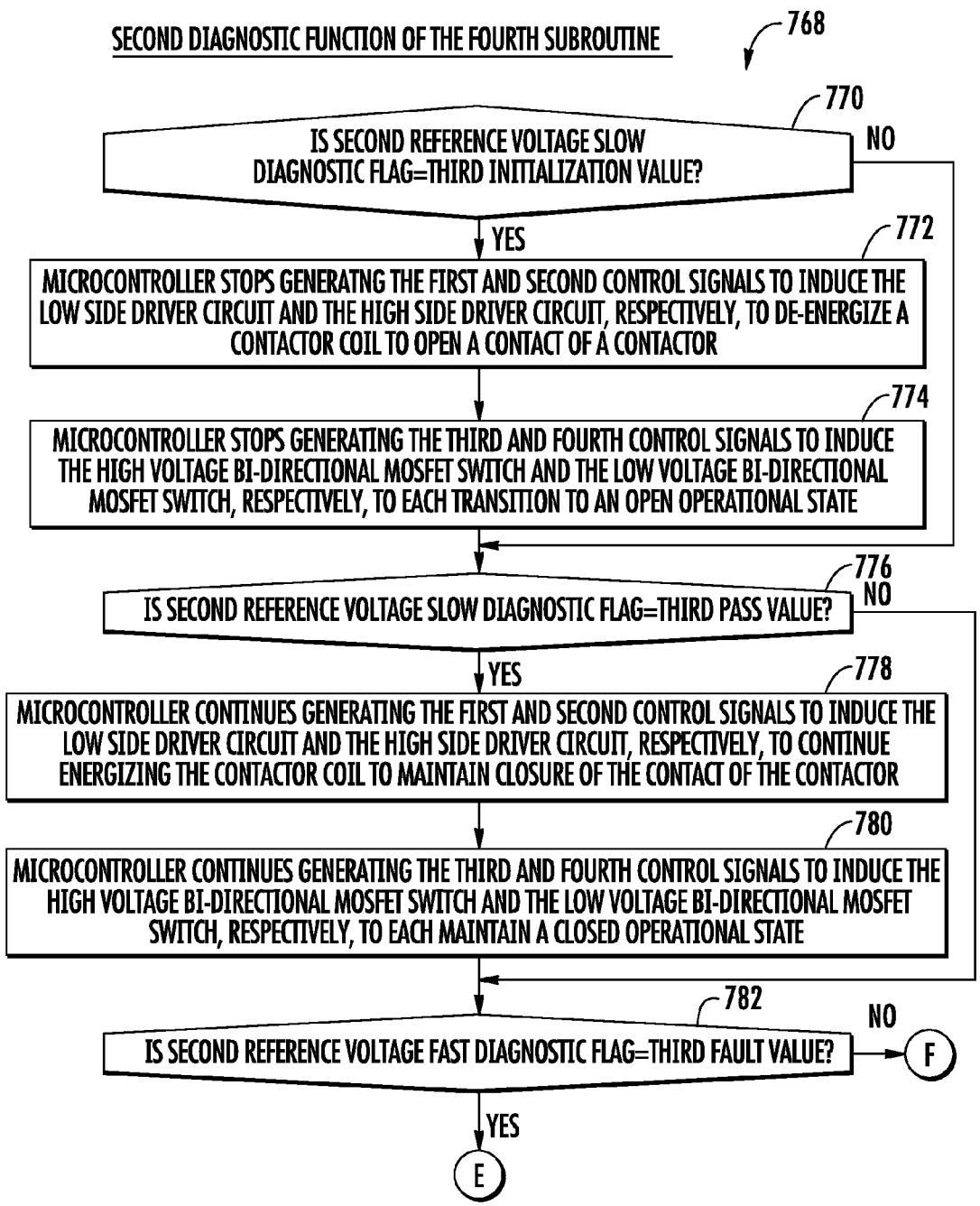
Figure 14:
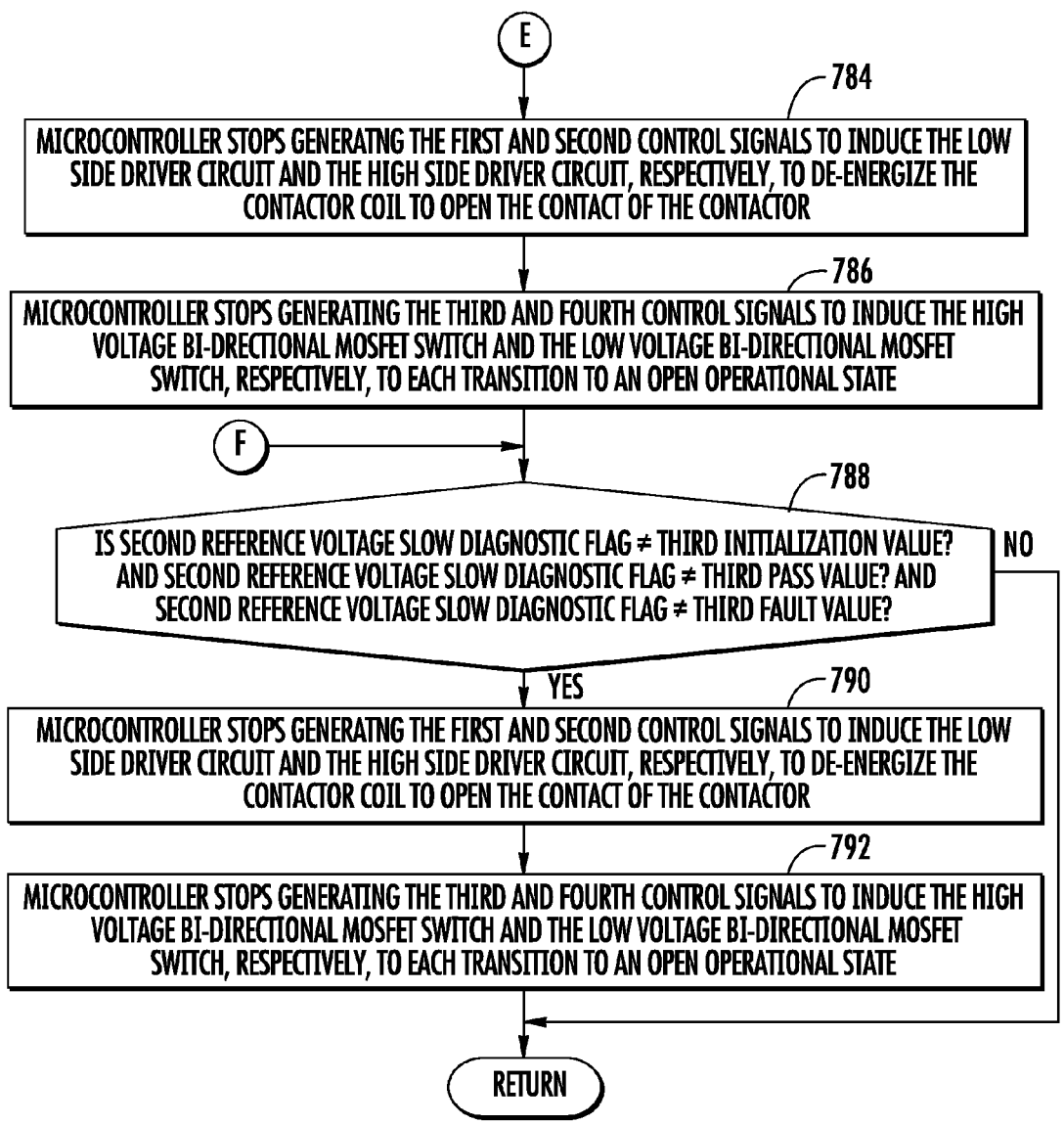

Referring to FIGS. 13 and 14, the second diagnostic function 768 of the fourth subroutine will now be explained.

At step 770, the microcontroller 60 makes a determination as to whether the second reference voltage slow diagnostic flag is equal to the third initialization value. If the value of step 770 equals "yes", the method advances to step 772. Otherwise, the method advances to step 776.

At step 772, the microcontroller 60 stops generating the first and second control signals to induce the low side driver circuit 150 and the high side driver circuit 152, respectively, to de-energize the contactor coil 280 to open the contact 282 of the contactor 154. After step 772, the method advances 774.

At step 774, the microcontroller 60 stops generating third and fourth control signals to induce the high voltage bi-directional MOSFET switch 340 and the low voltage bi-directional MOSFET switch 344, respectively, to transition to an open operational state. After step 774, the method advances to step 776.

At step 776, the microcontroller 60 makes a determination as to whether the second reference voltage slow diagnostic flag is equal to the third pass value. If the value of step 776 equals "yes", the method advances to step 778. Otherwise, the method advances to step 782.

At step 778, the microcontroller 60 continues generating the first and second control signals to induce the low side driver circuit 150 and the high side driver circuit 152, respectively, to continue energizing the contactor coil 280 to maintain closure of the contact 282 of the contactor 154. After step 778, the method advances to step 780.

At step 780, the microcontroller 60 continues generating the third and fourth control signals to induce the high voltage bi-directional MOSFET switch 340 and the low voltage bi-directional MOSFET switch 344, respectively, to maintain a closed operational state. After step 780, the method advances to step 782.

At step 782, the microcontroller 60 makes a determination as to whether the second reference voltage slow diagnostic flag is equal to the third fault value. If the value of step 782 equals "yes", the method advances to step 784. Otherwise, the method advances to step 788.

At step 784, the microcontroller 60 stops generating the first and second control signals to induce the low side driver circuit 150 and the high side driver circuit 152, respectively, to de-energize the contactor coil 280 to open the contact 282 of the contactor 154. After step 784, the method advances to step 786.

At step 786, the microcontroller 60 stops generating the third and fourth control signals to induce the high voltage bi-directional MOSFET switch 340 and the low voltage bi-directional MOSFET switch 344, respectively, to transition to an open operational state. After step 786, the method advances to step 788.

At step 788, the microcontroller 60 makes a determination as to whether the second reference voltage slow diagnostic flag is not equal to the third initialization value, and whether the second reference voltage slow diagnostic flag is not equal to the third pass value, and whether the second reference voltage slow diagnostic flag is not equal to the third fault value. If the value of step 788 equals "yes", method advances to step 790. Otherwise, the method returns to the main routine 580 (shown in FIG. 4).

At step 790, the microcontroller 60 stops generating the first and second control signals to induce the low side driver circuit 150 and the high side driver circuit 152, respectively, to de-energize the contactor coil 280 to open the contact 282 of the contactor 154. After step 790, the method advances to step 792.

At step 792, the microcontroller 60 stops generating the third and fourth control signals to induce the high voltage bi-directional MOSFET switch 340 and the low voltage bi-directional MOSFET switch 344, respectively, to transition to an open operational state. After step 792, the method returns to the main routine 580 (shown in FIG. 4).

Figure 15:
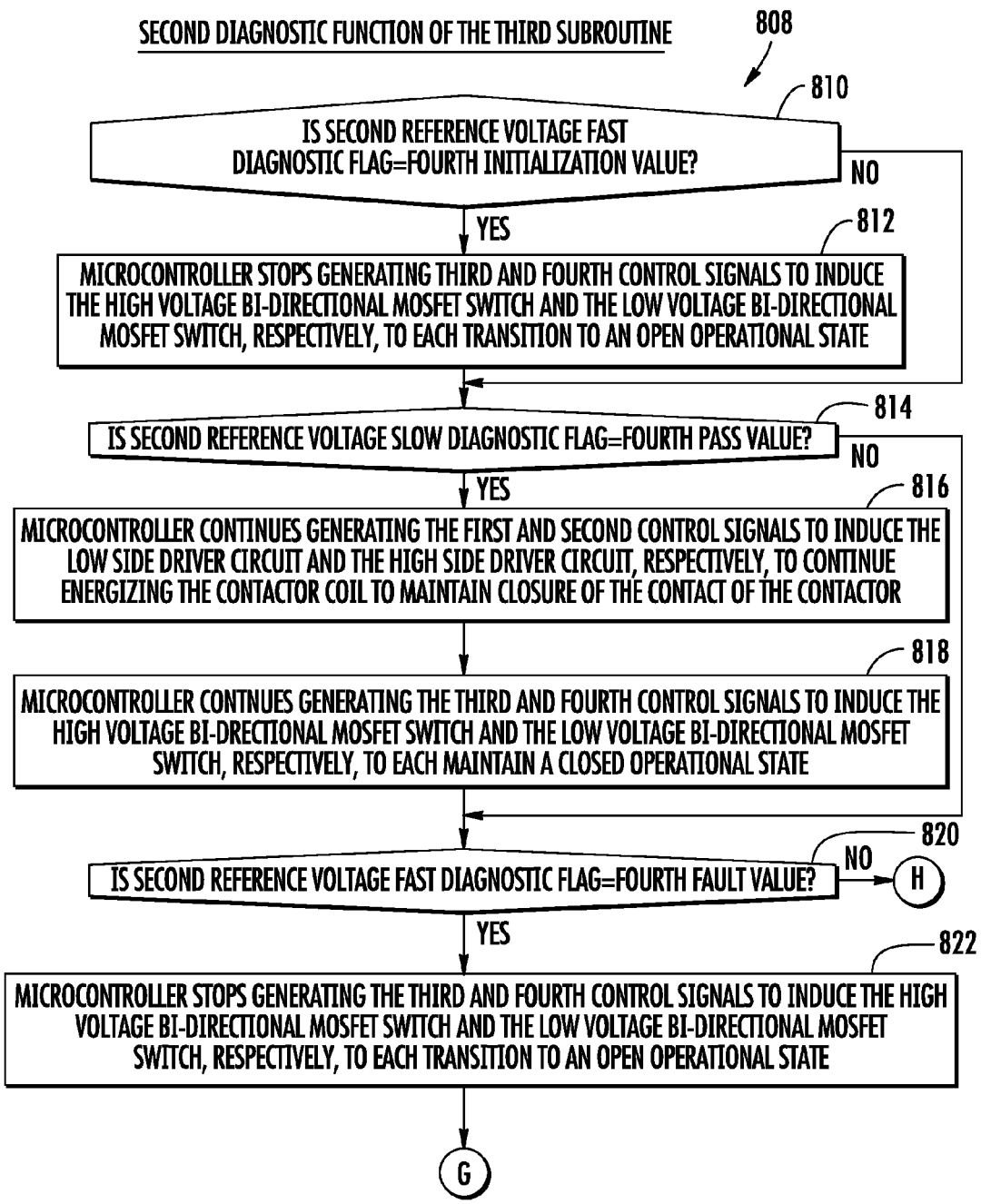
Figure 16:
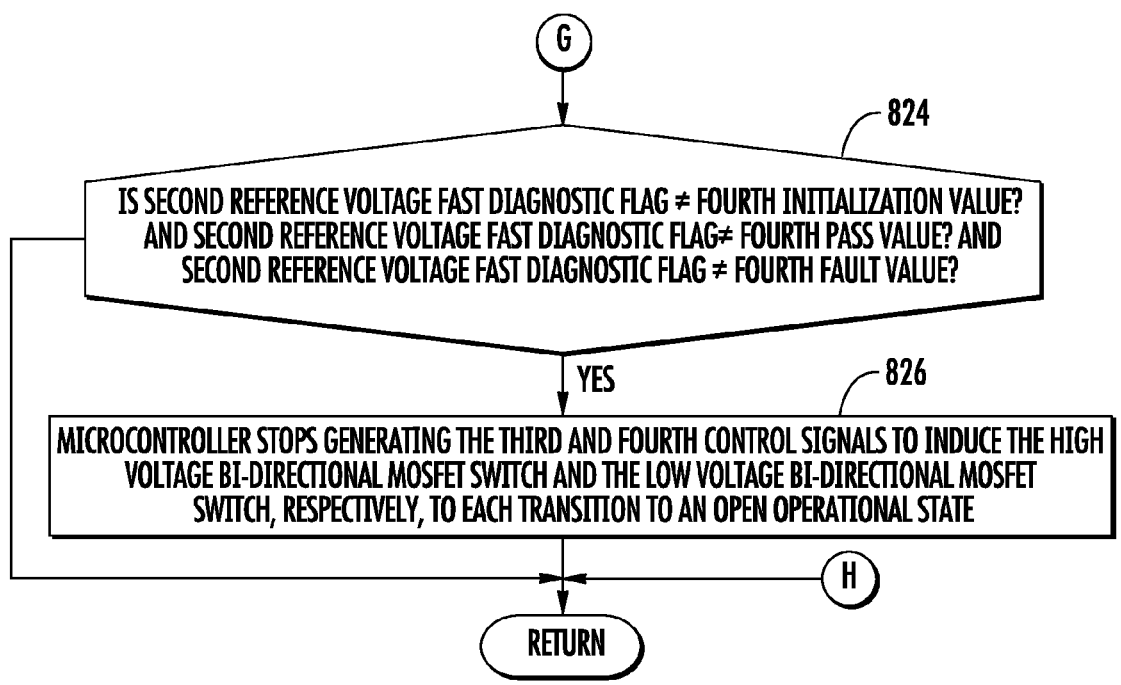

Referring to FIGS. 15 and 16, the second diagnostic function 808 of the third subroutine will now be explained.

At step 810, the microcontroller 60 makes a determination as to whether the second reference voltage fast diagnostic flag is equal to the fourth initialization value. If the value of step 810 equals "yes", the method advances to step 812. Otherwise, the method advances to step 814.

At step 812, the microcontroller 60 stops generating third and fourth control signals to induce the high voltage bi-directional MOSFET switch 340 and the low voltage bi-directional MOSFET switch 344, respectively, to transition to an open operational state. After step 812, the method advances to step 814.

At step 814, the microcontroller 60 makes a determination as to whether the second reference voltage fast diagnostic flag is equal to the fourth pass value. If the value of step 814 equals "yes", the method advances to step 816. Otherwise, the method advances to step 820.

At step 816, the microcontroller 60 continues generating the first and second control signals to induce the low side driver circuit 150 and the high side driver circuit 152, respectively, to continue energizing the contactor coil 280 to maintain closure of the contact 282 of the contactor 154. After step 816, the method advances to step 818.

At step 818, the microcontroller 60 continues generating the third and fourth control signals to induce the high voltage bi-directional MOSFET switch 340 and the low voltage bi-directional MOSFET switch 344, respectively, to maintain a closed operational state. After step 818, the method advances to step 820.

At step 820, the microcontroller 60 makes a determination as to whether the second reference voltage fast diagnostic flag is equal to the fourth fault value. If the value of step 820 equals "yes", the method advances to step 822. Otherwise, the method advances to step 824.

At step 822, the microcontroller 60 stops generating the third and fourth control signals to induce the high voltage bi-directional MOSFET switch 340 and the low voltage bi-directional MOSFET switch 344, respectively, to transition to an open operational state. After step 822, the method advances to step 824.

At step 824, the microcontroller 60 makes a determination as to whether the second reference voltage fast diagnostic flag is not equal to the fourth initialization value, and whether the second reference voltage fast diagnostic flag is not equal to the fourth pass value, and whether the second reference voltage fast diagnostic flag is not equal to the fourth fault value. If the value of step 824 equals "yes", the method advances to step 826. Otherwise, the method returns to the main routine 580 (shown in FIG. 4).

At step 826, the microcontroller 60 stops generating the third and fourth control signals to induce the high voltage bi-directional MOSFET switch 340 and the low voltage bi-directional MOSFET switch 344, respectively, to transition to an open operational state. After step 826, the method returns to the main routine 580 (shown in FIG. 4).

The diagnostic system for a power supply described herein provides a substantial advantage over other systems and methods. In particular, the diagnostic system for a power supply provides a technical effect of obtaining diagnostic diversity by sampling a reference voltage from the power supply using a common channel in a first bank of channels of an analog-to-digital converter, and then sampling the reference voltage using the common channel in a second bank of channels of the analog-to-digital converter to determine fault conditions associated with the power supply.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A diagnostic system for a power supply, the power supply having first and second output terminals outputting first and second reference voltages, respectively, comprising:
    a microcontroller having an analog-to-digital converter, the analog-to-digital converter having a first bank of channels and a second bank of channels; the first bank of channels including first and second common channels and at least first and second non-common channels, the second bank of channels including the first and second common channels and at least third and fourth non-common channels;
    the first common channel being electrically coupled to the first output terminal of the power supply for receiving the first reference voltage;
    the second common channel being electrically coupled to the second output terminal of the power supply for receiving the first reference voltage;
    the microcontroller being programmed to sample the first reference voltage at a first sampling rate utilizing the first common channel in the first bank of channels to obtain a first predetermined number of voltage samples;
    the microcontroller being further programmed to determine a first number of voltage samples in the first predetermined number of voltage samples in which the first reference voltage was outside of a predetermined voltage range;
    the microcontroller being further programmed to set a first power supply diagnostic flag equal to a first fault value if the first number of voltage samples is greater than a first threshold number of voltage samples;
    the microcontroller being further programmed to sample the first reference voltage at the first sampling rate utilizing the first common channel in the second bank of channels to obtain a second predetermined number of voltage samples;
    the microcontroller being further programmed to determine a second number of voltage samples in the second predetermined number of voltage samples in which the first reference voltage was outside of the predetermined voltage range; and
    the microcontroller being further programmed to set a second power supply diagnostic flag equal to a second fault value if the second number of voltage samples is greater than a second threshold number of voltage samples.

2. The diagnostic system of claim 1, wherein the microcontroller being further programmed to stop generating at least one control signal to induce a first switching device to transition to an open operational position, if the first power supply diagnostic flag is equal to the first fault value, or the second power supply diagnostic flag is equal to the second fault value.

3. The diagnostic system of claim 2, wherein the first switching device is a bi-directional MOSFET device.

4. The diagnostic system of claim 1, wherein:
    the microcontroller being further programmed to stop generating a first control signal to induce a first switching device to transition to an open operational position, if the first power supply diagnostic flag is equal to the first fault value, or the second power supply diagnostic flag is equal to the second fault value; and
    the microcontroller being further programmed to stop generating a second control signal to induce a second switching device to transition to the open operational state, if the first power supply diagnostic flag is equal to the first fault value, or the second power supply diagnostic flag is equal to the second fault value.

5. The diagnostic system of claim 4, wherein the first switching device is a contactor, and the second switching device is a bi-directional MOSFET switch.

6. The diagnostic system of claim 1, wherein the first reference voltage is utilized as an operational voltage for enabling operation of the microcontroller.

7. The diagnostic system of claim 1, wherein the second reference voltage is utilized as an operational voltage for enabling operation of the analog-to-digital converter.

* * * * *